United States Patent
Jung et al.

(10) Patent No.: US 9,635,459 B2
(45) Date of Patent: Apr. 25, 2017

(54) AUDIO REPRODUCTION METHOD AND APPARATUS WITH AUTO VOLUME CONTROL FUNCTION

(71) Applicant: Samsung Electronics Co., Ltd, Suwon-si, Gyeonggi-do (KR)

(72) Inventors: Chi-ho Jung, Seoul (KR); Ho-young Sung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 402 days.

(21) Appl. No.: 13/973,356

(22) Filed: Aug. 22, 2013

(65) Prior Publication Data

US 2013/0336502 A1 Dec. 19, 2013

Related U.S. Application Data

(62) Division of application No. 11/845,815, filed on Aug. 28, 2007, now abandoned.

(30) Foreign Application Priority Data

Feb. 1, 2007 (KR) .................. 10-2007-0010677

(51) Int. Cl.
*H04R 3/04* (2006.01)
*H03G 5/16* (2006.01)
*H03G 9/02* (2006.01)

(52) U.S. Cl.
CPC .............. *H04R 3/04* (2013.01); *H03G 5/165* (2013.01); *H03G 9/025* (2013.01)

(58) Field of Classification Search
CPC ........... H04R 3/04; H03G 5/165; H03G 9/025
See application file for complete search history.

(56) References Cited

U.S. PATENT DOCUMENTS

| 3,518,566 A | 6/1970 | Seymour |
| 5,046,101 A * | 9/1991 | Lovejoy .................. H03G 3/32 381/108 |
| 5,991,417 A | 11/1999 | Topholm |

(Continued)

FOREIGN PATENT DOCUMENTS

| GB | 951058 | 3/1964 |
| KR | 2003-38 | 1/2003 |

(Continued)

OTHER PUBLICATIONS

International Search Report dated May 1, 2008 issued in PCT/KR2008/385.

(Continued)

*Primary Examiner* — Sonia Gay
(74) *Attorney, Agent, or Firm* — Staas & Halsey LLP

(57) ABSTRACT

An audio reproduction method and apparatus, in which an audio volume is automatically controlled based on audio energy and human auditory characteristics. The audio reproduction method includes splitting a reproduction audio signal into audio signals corresponding to a plurality of frequency bands, extracting audio energy for each of the frequency bands, and comparing the audio energy for each of the frequency bands with a predetermined threshold and controlling the volume of the audio signal corresponding to each of the frequency bands.

23 Claims, 7 Drawing Sheets

(56) References Cited

U.S. PATENT DOCUMENTS

| | | | |
|---|---|---|---|
| 6,154,550 A | 11/2000 | Beyer | |
| 7,003,123 B2 | 2/2006 | Kanevsky et al. | |
| 7,013,011 B1* | 3/2006 | Weeks | H03G 9/025 381/107 |
| 7,469,208 B1* | 12/2008 | Kincaid | G06Q 99/00 381/104 |
| 2002/0076072 A1 | 6/2002 | Cornelisse | |
| 2003/0002688 A1* | 1/2003 | Kanevsky | H04R 3/00 381/74 |
| 2003/0103633 A1 | 6/2003 | Metcalfe, III | |
| 2004/0143433 A1 | 7/2004 | Marumoto et al. | |
| 2005/0141733 A1 | 6/2005 | Blamey et al. | |
| 2006/0018493 A1 | 1/2006 | Oh et al. | |
| 2006/0140418 A1* | 6/2006 | Koh et al. | 381/98 |
| 2006/0140425 A1* | 6/2006 | Berg et al. | 381/312 |
| 2007/0195970 A1* | 8/2007 | Ding | H04R 1/1091 381/72 |
| 2007/0253572 A1* | 11/2007 | Li | H04R 25/502 381/72 |
| 2007/0274531 A1 | 11/2007 | Camp | |
| 2007/0291959 A1* | 12/2007 | Seefeldt | H03G 3/32 381/104 |
| 2008/0013751 A1 | 1/2008 | Hiselius | |
| 2008/0205660 A1 | 8/2008 | Goldstein | |
| 2009/0092265 A1* | 4/2009 | Lovejoy | G10L 21/02 381/107 |

FOREIGN PATENT DOCUMENTS

| | | |
|---|---|---|
| KR | 2006-0009209 | 2/2006 |
| KR | 2006-79128 | 7/2006 |
| WO | 2006-047600 | 5/2006 |
| WO | WO 2006051586 A1 * | 5/2006 |
| WO | WO 2006075264 A1 * | 7/2006 |

OTHER PUBLICATIONS

Korean Office Action issued on Apr. 10, 2013 in KR Application No. 10-2007-0010677.

European Search Report issued Dec. 21, 2009 in EP Application No. 08712164.6.

Restriction Requirement, dated May 24, 2011, in U.S. Appl. No. 11/845,815.

Office Action, dated Jul. 15, 2011, in U.S. Appl. No. 11/845,815.

Final Office Action, dated Jan. 18, 2012, in U.S. Appl. No. 11/845,815.

Office Action, dated Oct. 4, 2012, in U.S. Appl. No. 11/845,815.

Final Office Action, dated May 22, 2013, in U.S. Appl. No. 11/845,815.

* cited by examiner

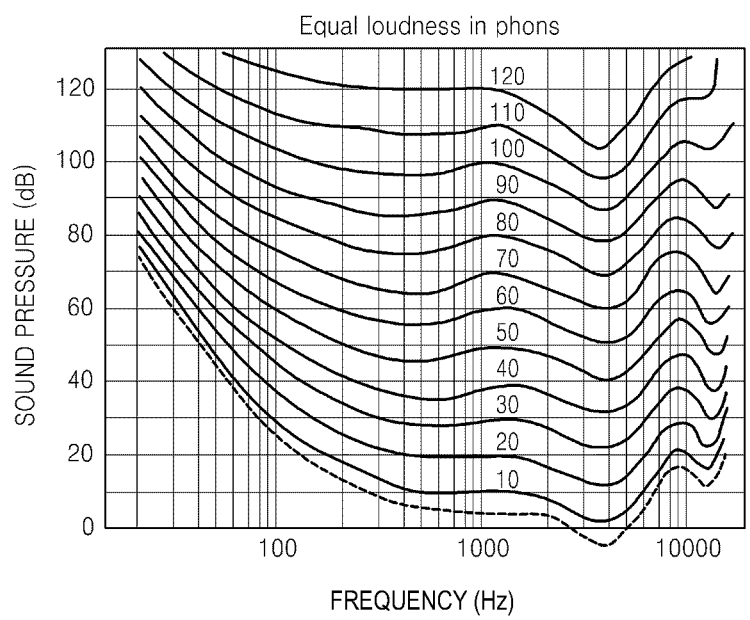

AUDIO REPRODUCTION METHOD AND APPARATUS WITH AUTO VOLUME CONTROL FUNCTION

CROSS-REFERENCE TO RELATED APPLICATIONS

This is a Divisional Application of prior application Ser. No. 11/845,815 filed on Aug. 28, 2007 in the United States Patent and Trademark Office, which claims the benefit of Korean Patent Application No. 10-2007-0010677, filed on Feb. 1, 2007, in the Korean Intellectual Property Office, the disclosure of which is incorporated herein in its entirety by reference.

BACKGROUND OF THE INVENTION

1. Field of the Invention

The present general inventive concept relates to an audio reproduction apparatus and method, and more particularly, to an audio reproduction apparatus and method, in which an audio volume can be automatically controlled based on audio energy and human auditory characteristics.

2. Description of the Related Art

Research on noise-induced hearing loss shows that hearing may be damaged by long-period exposure to noise of a higher level than a predetermined level. For this reason, various international industrial accident-related organizations establish noise exposure control regulations and use them as industrial accident-related standards.

As the number of users of portable devices and earphones (or headphones) increases, a more number of users complain of serious levels of hearing damage.

In this context, audio volume control apparatuses for protecting hearing have been developed.

U.S. 2003/0002688 A1, published on Jan. 2, 2003 and entitled "Volume Regulating and Monitoring System," discloses a conventional technique related to a conventional audio volume control apparatus.

In the conventional audio volume control apparatus, an input audio signal is converted into an electric signal, the electric signal is compared with a threshold, an alarm signal is generated every time the electric signal exceeds the threshold, and then the adjusted audio signal is output.

According to research on noise-induced hearing loss, it is known that hearing loss is proportional to the total energy of noise, i.e., (audio volume×time). In other words, according to noise exposure standards, hearing loss is induced by exposure to 85 dB noise for 8 hours, 88 dB noise for 4 hours, 91 dB noise for 2 hours, and 97 dB noise for 30 minutes.

According to the conventional technique related to the volume control apparatus, a threshold for preventing hearing loss is set by referring to only audio volume.

As a result, even if the audio signal is adjusted to below the threshold, hearing loss may also be induced by long-time exposure to the audio signal.

Moreover, the conventional volume control apparatus does not consider a fact that the sensitivity of ears varies with audio frequency components. Since the human ears are generally insensitive to low-frequency sound, they may feel intermediate/high-frequency sound louder when they concentrate on low-frequency sound.

SUMMARY OF THE INVENTION

The present general inventive concept provides an audio reproduction apparatus and method, in which an audio volume is automatically controlled based on audio energy and human auditory characteristics.

The present general inventive concept also provides an audio volume control apparatus and method to automatically control an audio volume based on human auditory characteristics.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an audio reproduction method including splitting a reproduction audio signal into audio signals corresponding to a plurality of frequency bands, extracting audio energy for each of the frequency bands, and comparing the audio energy for each of the frequency bands with a predetermined threshold and controlling a volume of an output audio signal corresponding to each of the frequency bands.

The foregoing and/or other aspects and utilities of the present general inventive concept may also be achieved by providing an audio reproduction apparatus including a band splitting unit to split a reproduction audio signal into audio signals corresponding to a plurality of frequency bands, an audio monitoring unit to accumulate reproduced audio energy for each of the frequency bands, to compare the accumulated audio energy for each of the frequency bands with a predetermined threshold, and to generate volume control information, and a volume control unit to control a volume of an input audio signal corresponding to each of the frequency bands according to the volume control information generated by the audio monitoring unit.

The foregoing and/or other aspects and utilities of the present general inventive concept may also be achieved by providing an audio volume control method including presetting a volume step and a volume control value for each frequency band based on human auditory characteristics, splitting an audio signal into audio signals corresponding to a plurality of frequency bands, determining the volume control value preset for each frequency band according to an input volume value, controlling the volume of each of the split audio signals according to the volume control value determined for each of the frequency bands, and synthesizing the split audio signals corresponding to the frequency bands.

The foregoing and/or other aspects and utilities of the present general inventive concept may also be achieved by providing an audio volume control apparatus including a storage unit to store a volume control value for each frequency band corresponding to a volume step based on human auditory characteristics, a band splitting unit to split an input audio signal into audio signals corresponding to a plurality of frequency bands, a volume processing unit to determine a volume control value for each frequency band, stored in the storage unit, according to an input volume value, a sub volume control unit to control a volume of each of the split audio signals according to the volume control value determined for each of the frequency bands by the volume processing unit, and a band synthesis unit to synthesize the split audio signals corresponding to the frequency bands whose volumes are controlled by the sub volume control unit.

The foregoing and/or other aspects and utilities of the present general inventive concept may also be achieved by providing an audio volume control apparatus to reproduce a reproduction audio signal from an input audio signal, the audio volume control apparatus including a volume control unit to control a plurality of frequency bands of the input audio signal according to corresponding ones of characteristics of the respective frequency bands of the reproduction audio signal.

The characteristics of the respective frequency bands may include at least one of an audio reproduction time counted according to each sample value of the frequency bands and a threshold, and audio volume value generated according to each volume value of the frequency bands and a user input volume value.

The volume control unit may reproduce the reproduction audio signal from a previous input audio signal.

The volume control unit may control a volume of each of the plurality of frequency bands of the input audio signal according to a user input volume control signal and a corresponding one of characteristics of the respective frequency bands of the reproduction audio signal.

The user input volume control signal may include a signal to control an overall volume of the reproduction audio signal.

The user input volume control signal may include a signal to control a volume of each of the plurality of frequency bands of the reproduction audio signal.

The user input volume control signal may be compared to each of the corresponding one of characteristics of the respective frequency bands of the reproduction audio signal to generate a volume control signal to control each volume of the frequency bands of the input audio signal.

The characteristics of the respective frequency bands of the reproduction audio signal may include a reproduction time of each of frequency bands of the reproduction audio signal with respect to a reference.

The reproduction time may include the number of times counted when a level of each of the frequency bands of the reproduction audio signal is greater than a reference, for a predetermined period of time.

The characteristics of the respective frequency bands of the reproduction audio signal may include an audio energy of each of the frequency bands of the reproduction audio signal with respect to a reference.

The characteristics of the respective frequency bands of the reproduction audio signal may include a reproduction time and an audio energy of each of the frequency bands of the reproduction audio signal with respect to a reference The audio volume control apparatus may further include a band splitting unit to split the production audio signal into the plurality of frequency bands and to split the input audio signal into the plurality of frequency bands.

The volume control unit may include sub-volume control units to correspond to the respective frequency bands.

Each of the sub-volume control units may measure a gain value of each of the frequency bands of the input audio signal, and compares the gain value of each of the frequency bands of the input audio signal with a corresponding volume control value to calculate a final gain value to be applied to the input audio signal Each of the sub-volume control units may comprise a level measurement unit to measure a gain value of each of the frequency bands of the input audio signal, a level comparison unit to compare the gain value of each of the frequency bands of the input audio signal with a corresponding volume control value to generate a comparison result, and a level calculation unit to calculate a final gain value according to the comparison result, so that the final gain value is applied to the input audio signal.

The volume control unit may control a plurality of frequency bands of the input audio signal according to an equal loudness curve and the characteristics of the respective frequency bands of the reproduction audio signal.

The foregoing and/or other aspects and utilities of the present general inventive concept may also be achieved by providing an audio volume control apparatus, including a volume control unit to reproduce a reproduction audio signal from an input audio signal and to control a plurality of frequency bands of a second input audio signal according to a reference volume signal and corresponding ones of characteristics of the respective frequency bands of the reproduction audio signal.

The foregoing and/or other aspects and utilities of the present general inventive concept may also be achieved by providing a computer-readable medium containing computer-readable codes as a program to execute a method of an audio volume control apparatus, the method including reproducing a reproduction audio signal from an input audio signal, and controlling a plurality of frequency bands of a second input audio signal according to a reference volume signal and corresponding ones of characteristics of the respective frequency bands of the reproduction audio signal.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 7 is a graph of an equal loudness curve showing human auditory characteristics;

FIG. 8 illustrates an example of a database for storing volume values determined for different frequency bands by a volume processing unit illustrated in FIG. 4;

DETAILED DESCRIPTION OF THE PREFERRED EMBODIMENTS

Figure 1:
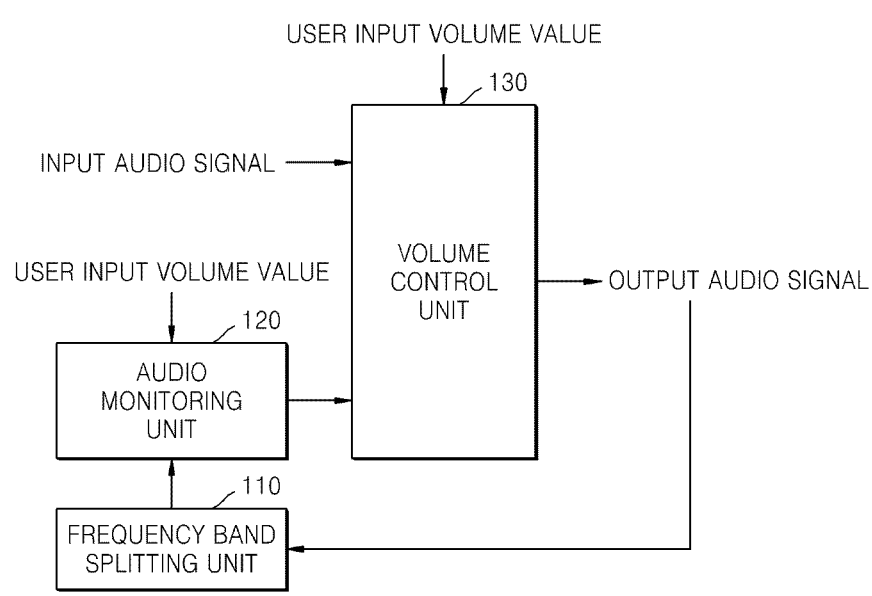
FIG. 1 is a block diagram of an audio reproduction apparatus according to a first exemplary embodiment of the present invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram of an audio reproduction apparatus according to a first exemplary embodiment of the present invention.

Referring to FIG. 1, the audio reproduction apparatus includes a frequency band splitting unit 110, an audio monitoring unit 120, and a volume control unit 130.

The frequency band splitting unit 110 splits a reproduction (or output) audio signal into audio signals corresponding to a plurality of frequency bands using a Frequency band pass filter or a quadrature mirror filter (QMF).

The audio monitoring unit 120 calculates the energy of an audio signal corresponding to each of the frequency bands based on a user input volume value and audio reproduction information corresponding to a predetermined period of time, compares the calculated energy with a predetermined threshold, and generates volume control information for a corresponding frequency band if the energy for the frequency band exceeds the threshold. At this time, the volume control information includes a volume control value and an alarm signal of a predetermined pattern.

The volume control unit 130 divides an input audio signal into audio signals corresponding to a plurality of frequency bands using a Frequency bandpass filter or a QMF and controls amplitude of the audio signal corresponding to each of the frequency bands differently according to a volume control value generated by the audio monitoring unit 120.

Figure 2:
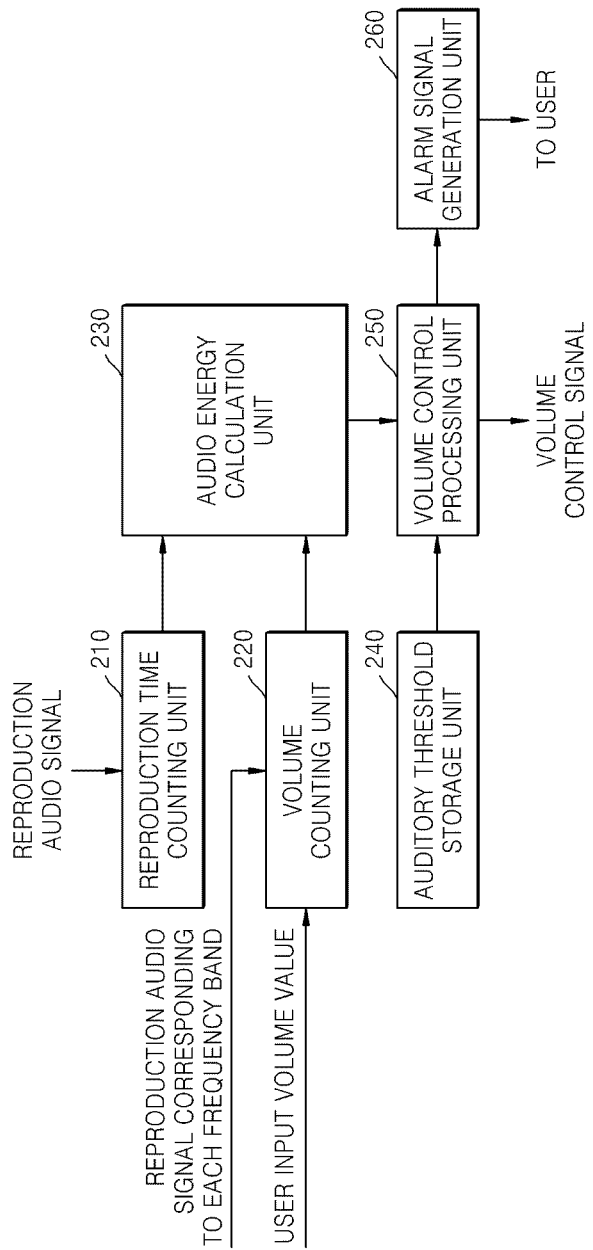
FIG. 2 is a detailed block diagram of an audio monitoring unit illustrated in FIG. 1.

FIG. 2 is a detailed block diagram of the audio monitoring unit 120 of FIG. 1.

Referring to FIG. 2, a reproduction time counting unit 210 counts an audio reproduction time during which an audio sample value of the reproduced audio signal exceeds a minimum threshold value for a predetermined period of time and stores the counted audio reproduction time as a count value. The reproduction time counting unit 210 may count the audio reproduction time with respect to the entire reproduction frequency band.

The volume counting unit 220 calculates the average of reproduced audio samples for each of the frequency bands at predetermined time intervals and extracts the calculated average as an audio volume value for the frequency band.

In another exemplary embodiment of the present invention, the volume counting unit 220 compares a user input volume value with a reproduced audio volume value for each of the frequency bands and extracts an audio volume value (or loudness) for the frequency band.

The audio energy calculation unit 230 calculates audio energy for each of the frequency bands based on the counted audio reproduction time stored in the reproduction time counting unit 210 and/or the extracted audio volume value extracted by the volume counting unit 220. For example, audio energy E can be expressed by an integral equation as follows:

$$E = \int (T \times V) dt \quad (1)$$

where T indicates an audio reproduction time and V indicates an audio volume value.

The auditory threshold storage unit 240 stores a threshold value for each of the frequency bands in order to prevent hearing damage based on human auditory characteristics. Generally, the human auditory characteristics can be expressed as an equal loudness curve as illustrated in FIG. 7.

The volume control processing unit 250 compares the threshold for each of the frequency bands, which is stored in the auditory threshold storage unit 240, with the audio energy for each of the frequency bands, which is calculated by the audio energy calculation unit 230, and generates volume control information, for example, an alarm signal of a particular pattern and a volume control signal indicating an excessive amount of the audio energy if the audio energy exceeds the threshold.

The alarm signal generation unit 260 generates an audio signal of the particular pattern every time it receives the alarm signal of the particular pattern from the volume control processing unit 250.

Figure 3:
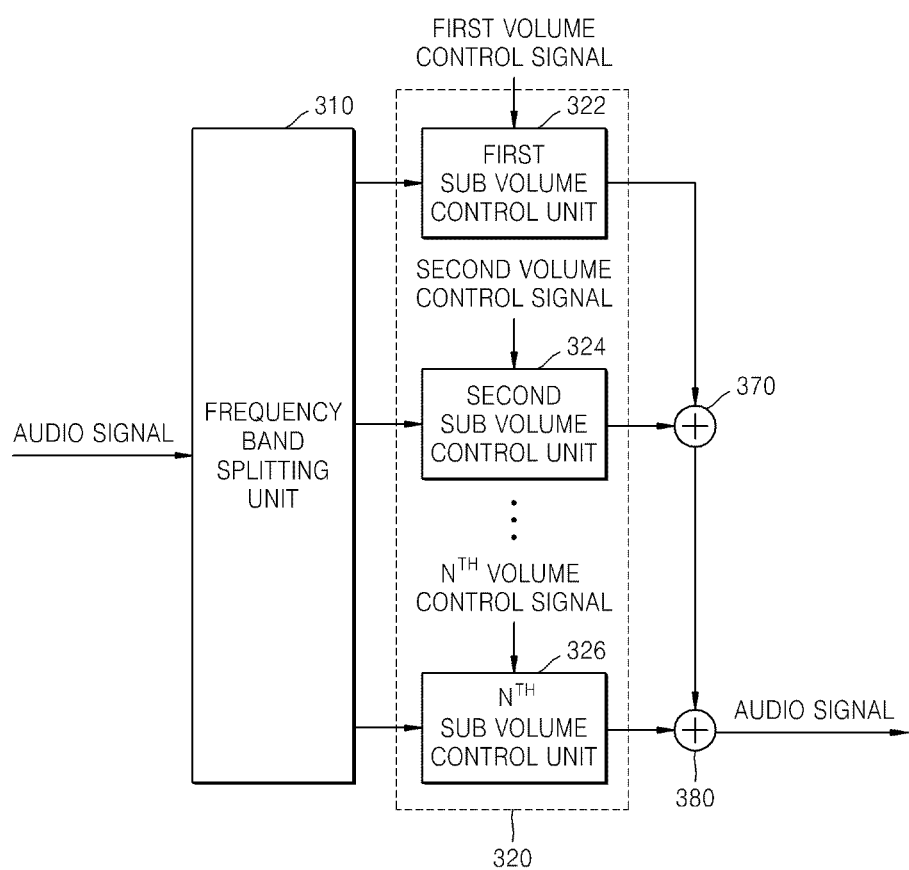
FIG. 3 is a detailed block diagram of a volume control unit illustrated in FIG. 1.

FIG. 3 is a detailed block diagram of the volume control unit 130 of FIG. 1.

A frequency band splitting unit 310 splits the input audio signal into audio signals corresponding to a plurality of frequency bands using the frequency band pass filter and the QMF. A sub volume control unit 320 controls the volume of the audio signal split by the frequency band splitting unit 310 according to the volume control signal generated by the audio monitoring unit 120. For example, when the frequency band splitting unit 310 generates an audio signal corresponding to a first sub-frequency band, an audio signal corresponding to a second sub-frequency band, ..., and an audio signal corresponding to an $n^{th}$ sub-frequency band, and the audio monitoring unit 120 generates a first volume control signal for the first sub-frequency band, a second volume control signal for the second sub-frequency band, ..., and an $n^{th}$ volume control signal for the $n^{th}$ sub-frequency band. A first sub volume control unit 322 then increases or reduces an audio volume value for the first sub-frequency band according to the first volume control signal and the user input volume value, a second sub volume control unit 324 increases or reduces an audio volume value for the second sub-frequency band according to the second volume control signal and the user input volume value, and an $n^{th}$ sub volume control unit 326 increases or reduces an audio volume value for the $n^{th}$ sub-frequency band according to the $n^{th}$ volume control signal and the user input volume value. Thus, it is possible that when a user increases an audio volume, the volume of a low-frequency sound is maintained as is and the volume of an intermediate/high-frequency sound is increased. In addition, the volume of a frequency band in which much energy is accumulated is gradually reduced.

Adders 370 and 380 synthesize the audio signals for the frequency bands whose volumes are controlled by the sub volume control unit 320, thereby reconstructing the original audio signal.

Figure 4:
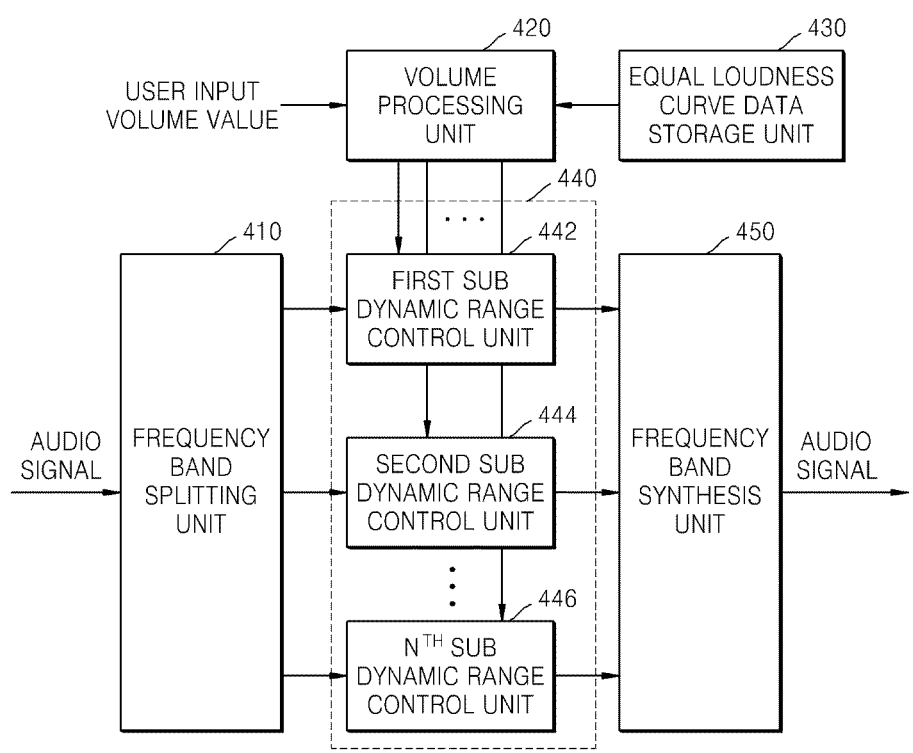
FIG. 4 is a block diagram of an audio reproduction apparatus according to a second exemplary embodiment of the present invention.

FIG. 4 is a block diagram of an audio reproduction apparatus according to a second exemplary embodiment of the present invention.

Referring to FIG. 4, the audio reproduction apparatus includes a frequency band splitting unit 410, an equal loudness curve data storage unit 430, a volume processing unit 420, a sub volume control unit 440, and a frequency band synthesis unit 450. The sub volume control unit 440 includes a first sub dynamic range control unit 442, a second sub dynamic range control unit 444, ..., and an $n^{th}$ sub dynamic range control unit 446.

The frequency band splitting unit 410 splits an input audio signal into audio signals corresponding to one or more frequency bands using a frequency band pass filter or a QMF.

The equal loudness curve data storage unit 430 stores an audio volume control value for each frequency band according to a volume step by referring to an equal loudness curve. The audio volume control value is information about an audio volume value that has to be maintained for each frequency band.

The volume processing unit 420 reads the audio volume control value corresponding to a user input volume step from the equal loudness curve data storage unit 430.

The sub volume control unit 440 performs a dynamic range control on a volume of the audio signal corresponding to each frequency band split by the frequency band splitting unit 410 according to the audio volume control value for each frequency band that is read by the volume processing unit 420. In other words, the first sub dynamic range control unit 442 controls the volume of an audio signal corresponding to a first sub frequency band according to a volume control value for the first sub frequency band read by the volume processing unit 420. The second sub dynamic range control unit 444 controls the volume of an audio signal corresponding to a second sub frequency band according to a volume control value for the second sub frequency band read by the volume processing unit 420. The $n^{th}$ sub dynamic range control unit 446 controls the volume of an audio signal corresponding to an $n^{th}$ sub frequency band according to a volume control value for the $n^{th}$ sub frequency band read by the volume processing unit 420.

The frequency band synthesis unit 450 synthesizes the audio signals corresponding to the frequency bands whose volumes are controlled by the sub volume control unit 440 using an inverse QMF synthesis technique.

Figure 5:
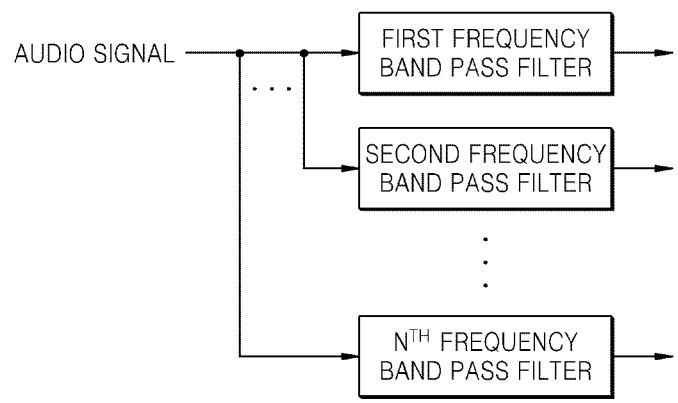
FIG. 5 is a block diagram of an example of a frequency band splitting unit illustrated in FIG. 4.

FIG. 5 is a block diagram of an example of the frequency band splitting unit 410 of FIG. 4.

Referring to FIGS. 4 and 5, the frequency band splitting unit 410 splits an audio signal into audio signals corresponding to a plurality of desired frequency bands using a plurality of frequency band pass filters, i.e., a first frequency band pass filter through an $n^{th}$ frequency band pass filter. The frequency band pass filters may be $2^{nd}$-order or $4^{th}$-order infinite impulse response (IIR) filters.

Figure 6:
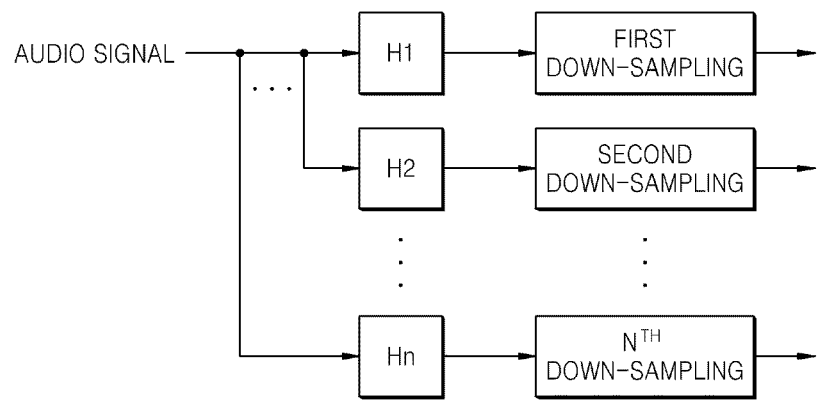
FIG. 6 is a block diagram of another example of a frequency band splitting unit illustrated in FIG. 4.

FIG. 6 is a block diagram of another example of the frequency band splitting unit 410 of FIG. 4.

Referring to FIGS. 4 and 6, the frequency band splitting unit 410 splits an audio signal into audio signals corresponding to a plurality of desired sub frequency bands using QMFs. In FIG. 6, H1, H2, . . . , HN indicate complex gain values for the sub frequency bands. The split audio signals are down-sampled through first through $n^{th}$ down-sampling processes.

FIG. 7 is a graph of an equal loudness curve showing the human auditory characteristics.

Physically measured sound pressure (or sound intensity) is not equal to volume that is actually perceived by the human auditory system. The human ears have irregular response property with respect to audible frequency sound. For example, the sensitivity of the human ears to sound of 1-5 kHz is very high, whereas the sensitivity of human ears to sound below or over 1-5 kHz is very low.

A graph showing the human auditory characteristics is called an equal loudness curve.

FIG. 8 illustrates an example of the equal loudness curve data storage unit 430 of FIG. 4.

Referring to FIGS. 4 through 8, the equal loudness curve data storage unit 430 stores volume control values g11, g12, . . . , gNM for frequency band 1, frequency band 2, . . . , frequency band M according to volume step 1, volume step 2, . . . , volume step N. The volume control values g11, g12, . . . , gNM are information about volume values that have to be maintained for frequency band 1, frequency band 2, . . . , frequency band M, respectively, and are determined with reference to the equal loudness curve. For example, for the volume step 2 of 40 dB, volume control values of 100 Hz (frequency band 1), 200 Hz (frequency band 2), and 300 Hz (frequency band 3) are determined as 52 dB, 40 dB, and 38 dB with reference to the equal loudness curve illustrated in FIG. 7. Thus, the equal loudness curve data storage unit 430 stores a total of N×M volume control values when N volume steps and M frequency bands are determined. In another exemplary embodiment of the present invention, the volume control values g11, g12, . . . gNM may be updated according to audio energy accumulated for the frequency band 1, frequency band 2, . . . , frequency band M.

Figure 9:
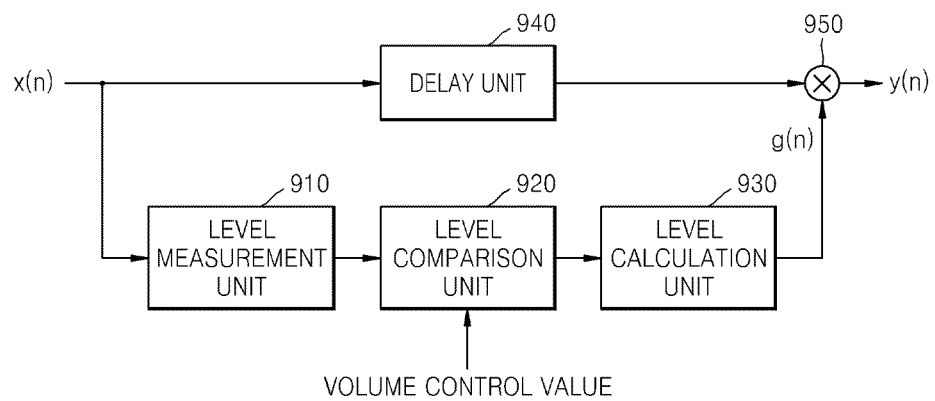
FIG. 9 is a block diagram of an example of a sub dynamic range control unit of a sub-volume control unit illustrated in FIG. 4.

FIG. 9 is a block diagram of an example of the sub dynamic range control unit 440 of FIG. 4.

Referring to FIGS. 4 and 9, a level measurement unit 910 measures the gain value for each of the frequency bands split by the frequency band splitting unit 410.

A level comparison unit 920 compares the volume control value for each frequency band read by the volume processing unit 420 with the gain value for the frequency band measured by the level measurement unit 910, so that a gain value g(n) is output according to the comparison result. For example, a gain value of an input audio signal X(n) is compared with a volume control value. When the gain value is less than the volume control value, the gain value is increased by the volume control value. When the gain value is greater than the volume control value, the gain value is reduced by the volume control value.

A gain calculation unit 930 calculates the gain value g(n) to be applied to the input audio signal X(n) using the gain value determined by the level comparison unit 920 and a previous gain value.

A delay unit 940 delays the input audio signal X(n) until the gain value g(n) to be applied to the input audio signal X(n) is calculated.

A multiplier 950 multiplies the input audio signal X(n) by the gain value g(n) calculated by the gain calculation unit 930, thereby generating an output audio signal Y(n).

Figure 10:
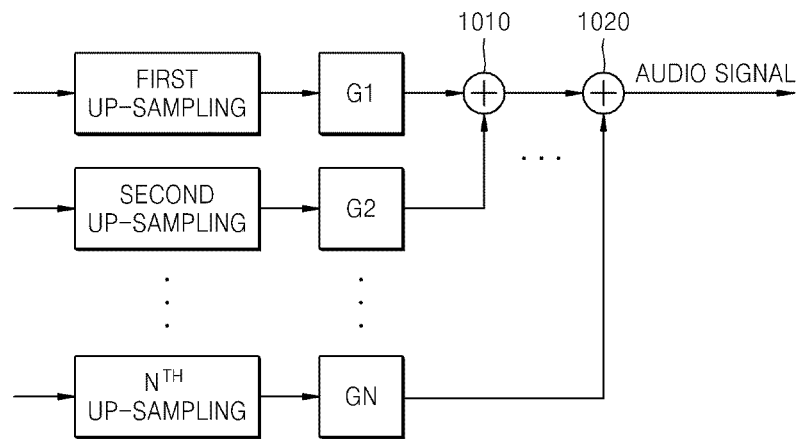
FIG. 10 is a block diagram of a frequency band synthesis unit illustrated in FIG. 4.

FIG. 10 is a block diagram of the frequency band synthesis unit 450 of FIG. 4.

Referring to FIGS. 4 and 10, the audio signals corresponding to the frequency bands are up-sampled by a first up-sampling process, a second up-sampling process, . . . , an $n^{th}$ up-sampling process. The up-sampled audio signals are compensated by corresponding ones of gain values G1, G2, . . . , GN. The gain values G1, G2, . . . GN are complex gain values of QMFs. Finally, the audio signals corresponding to the frequency bands are synthesized by adders 1010 and 1020, thereby being reconstructed to a broad band signal having frequency components like the input audio signal.

As described above, according to the present general inventive concept, a signal having components as shown in the equal loudness curve is the loudest sound that can be perceived by the human ears. Thus, an audio volume can be adjusted for each frequency band based on a user input volume value and the equal loudness curve. Moreover, an alarm signal can be generated for each frequency band when audio energy approximates a threshold. At the same time, unnecessary audio energy reproduction is prevented, thereby preventing hearing damage. Therefore, by automatically controlling the audio volume using audio energy accumulated for each frequency band, safe and reliable hearing protection can be achieved. Furthermore, by controlling the audio volume for each frequency band according to the equal loudness curve, an optimized equalizer can be implemented.

The present invention can also be embodied as computer readable code on a computer readable medium. The computer-readable medium may include a computer-readable recording medium and a computer-readable transmission medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves. The computer readable transmission medium can also be distributed over network coupled computer systems, for example, a wired or wireless network or the Internet, so that the computer readable code is stored and executed in a distributed fashion.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An audio reproduction method comprising:
   splitting a reproduction audio signal into a plurality of audio signals corresponding to a plurality of frequency bands;
   extracting audio energy for each of the plurality of frequency bands based on a predetermined audio reproduction time and a user input volume value;
   comparing the audio energy for each of the plurality of frequency bands with a predetermined threshold of each of the plurality of frequency bands; and
   controlling a plurality of volumes of the plurality of audio signals corresponding to each of the plurality of frequency bands based on the comparing of the audio energy.

2. The audio reproduction method of claim 1, wherein the predetermined thresholds comprise preset auditory characteristic data.

3. The audio reproduction method of claim 1, wherein the extraction of the plurality of audio energies comprises:
   extracting, from at least one audio signal of the plurality of audio signals, an audio volume value of a frequency band of the plurality of frequency bands;
   storing a reproduction time of the audio volume value which corresponds to an amount of time that the audio volume value of the plurality of frequency band exceeds another predetermined threshold of the frequency band; and
   calculating the audio energy of audio energies based on the stored reproduction time and the extracted audio volume value.

4. The audio reproduction method of claim 1, wherein the controlling of the plurality of volumes of the plurality of audio signals comprises:
   comparing the audio energy for each of the plurality of frequency bands with the predetermined threshold for each of the plurality of frequency bands;
   generating a volume control signal every time the audio energy of each of the plurality of frequency bands exceeds the plurality of predetermined thresholds; and
   controlling the plurality of volumes of the plurality of audio signals corresponding to each of the plurality of frequency bands according to the generated volume control signal for each of the plurality of frequency bands which exceed the plurality of predetermined thresholds.

5. The audio reproduction method of claim 1, further comprising:
   generating a predetermined alarm signal for a corresponding frequency band of the plurality of frequency bands if an audio energy of the plurality of audio energies for a frequency band exceeds a predetermined threshold of the plurality of predetermined thresholds.

6. An audio reproduction apparatus comprising:
   a memory to store a reproduction audio signal; and
   a processor connected to the memory and configured to:
      split the reproduction audio signal into a plurality of audio signals corresponding to a plurality of frequency bands,
      accumulate reproduced audio energy for each of the frequency bands based on a predetermined audio reproduction time and an audio volume value for the plurality of frequency bands,
      compare the reproduced audio energy for each of the plurality of frequency bands with a plurality of predetermined thresholds of the plurality of frequency bands,
      generate volume control information for a corresponding frequency band of the plurality of frequency bands if an audio energy for a frequency band exceeds a predetermined threshold of the plurality of predetermined thresholds, and
      control a plurality of volumes of the plurality of audio signals corresponding to each of the plurality of frequency bands according to the generated volume control information.

7. The audio reproduction apparatus of claim 6, wherein the processor is further configured to:
   extract, from at least one audio signal of the audio signals, an audio volume value of a frequency band of the plurality of frequency bands,
   determine the predetermined audio reproduction time of the extracted audio volume value which corresponds to an amount of time that the extracted audio volume value of the frequency band exceeds another predetermined threshold of the frequency band; and
   calculate the audio energy of audio energies based on the predetermined audio reproduction time, the extracted audio volume value and a volume control signal indicating an excessive amount of the audio energy based on the predetermined audio reproduction time.

8. The audio reproduction apparatus of claim 7, wherein the processor is further configured to split the audio signal into second audio signals corresponding to the plurality of frequency bands, and to control a volume of the volumes of one of the second audio signals split by the processor according to the volume control signal.

9. An audio volume control apparatus to reproduce a reproduction audio signal from an input audio signal, comprising:
   a memory to store the input audio signal, and
   a processor configured to:
      control a plurality of volumes of a plurality of frequency bands of the input audio signal according to corresponding characteristics of the respective frequency bands of the reproduction audio signal,
      wherein the corresponding characteristics of at least one of the respective frequency bands of the reproduction audio signal comprises an audio reproduction time counted according to the at least one of the respective frequency bands of the plurality of frequency bands.

10. The audio volume control apparatus of claim 9, wherein the characteristics of the respective frequency bands further comprise a plurality of thresholds generated according to each volume value of the frequency bands and a user input volume value and an audio volume value generated according to each volume value of the frequency bands and the user input volume value.

11. The audio volume control apparatus of claim 9, wherein the processor is further configured to reproduce the reproduction audio signal from a previous input audio signal.

12. The audio volume control apparatus of claim 9, wherein the processor is further configured to control the volumes of each of the plurality of frequency bands of the input audio signal according to a user input volume control signal and a corresponding one of characteristics of the respective frequency bands of the reproduction audio signal.

13. The audio volume control apparatus of claim 12, wherein the user input volume control signal comprises a signal to control an overall volume of the reproduction audio signal.

14. The audio volume control apparatus of claim 12, wherein the user input volume control signal comprises signals to control the volumes of each of the plurality of frequency bands of the reproduction audio signal.

15. The audio volume control apparatus of claim 12, wherein the user input volume control signal is compared to each of the corresponding one of characteristics of the respective frequency bands of the reproduction audio signal to generate a volume control signal to control each volume of the frequency bands of the input audio signal.

16. The audio volume control apparatus of claim 9, wherein the characteristics of the respective frequency bands of the reproduction audio signal comprise a reproduction time of each of frequency bands of the reproduction audio signal with respect to a reference.

17. The audio volume control apparatus of claim 16, wherein the reproduction time comprises an amount of time when a level of each of the frequency bands of the reproduction audio signal is greater than a reference of each frequency band of the frequency bands.

18. The audio volume control apparatus of claim 9, wherein the characteristics of the respective frequency bands of the reproduction audio signal comprise an audio energy of each of the frequency bands of the reproduction audio signal with respect to a reference.

19. The audio volume control apparatus of claim 9, wherein the characteristics of the respective frequency bands of the reproduction audio signal comprise a reproduction time and an audio energy of each of the frequency bands of the reproduction audio signal with respect to a reference.

20. The audio volume control apparatus of claim 9, wherein the processor splits the reproduction audio signal into the plurality of frequency bands and splits the input audio signal into the plurality of frequency bands.

21. The audio volume control apparatus of claim 9, wherein the processor is configured to measure a gain value of each of the plurality of frequency bands of the input audio signal, and to compare the gain value of each of the plurality of frequency bands of the input audio signal with a corresponding volume control value to calculate a final gain value to be applied to the input audio signal.

22. The audio volume control apparatus of claim 9, wherein the processor is configured to measure a gain value of each of the plurality of frequency bands of the input audio signal, to compare the gain value of each of the plurality of frequency bands of the input audio signal with a corresponding volume control value to generate a comparison result, and to calculate a final gain value according to the comparison result, so that the final gain value is applied to the input audio signal.

23. The audio volume control apparatus of claim 9, wherein the processor is configured to control a plurality of frequency bands of the input audio signal according to an equal loudness curve and the characteristics of the respective frequency bands of the reproduction audio signal.

* * * * *